United States Patent
Johnson et al.

(10) Patent No.: US 6,524,122 B1
(45) Date of Patent: Feb. 25, 2003

(54) RETRACTABLE CONNECTOR FOR USE WITH ELECTRONIC DEVICES

(75) Inventors: Thomas A. Johnson, Draper, UT (US); Jeffrey L. Jones, Orem, UT (US); David Oliphant, Salt Lake City, UT (US)

(73) Assignee: 3Com Corporation, Santa Clara, CA (US)

(*) Notice: Subject to any disclaimer, the term of this patent is extended or adjusted under 35 U.S.C. 154(b) by 42 days.

(21) Appl. No.: 09/624,940

(22) Filed: Jul. 25, 2000

(51) Int. Cl.[7] .............................................. H01R 13/44
(52) U.S. Cl. ................................................... 439/131
(58) Field of Search ................................. 439/131, 676; 174/69; 361/754, 798, 801

(56) References Cited

U.S. PATENT DOCUMENTS

| | | | | |
|---|---|---|---|---|
| 2,656,233 A | * | 10/1953 | Bollmann | 312/61 |
| 3,257,156 A | * | 6/1966 | Sisk et al. | 312/273 |
| 4,023,875 A | * | 5/1977 | Difley et al. | 312/319 |
| 5,183,404 A | * | 2/1993 | Aldous et al. | 439/55 |
| 5,547,401 A | * | 8/1996 | Aldous et al. | 439/676 |
| 5,773,332 A | * | 6/1998 | Glad | 439/344 |
| 5,957,718 A | * | 9/1999 | Cheng et al. | 439/347 |
| 5,989,042 A | * | 11/1999 | Johnson et al. | 439/131 |
| 6,129,566 A | * | 10/2000 | Davis et al. | 439/131 |
| 6,198,632 B1 | * | 3/2001 | Goff | 361/752 |
| 6,271,803 B1 | * | 8/2001 | Watanabe et al. | 343/895 |

* cited by examiner

Primary Examiner—Tulsidas Patel
Assistant Examiner—Thanh-Tam Le
(74) Attorney, Agent, or Firm—Workman, Nydegger & Seeley

(57) ABSTRACT

A communication card includes a retractable connector that is smoothly extendable and retractable. A torsion spring is positioned within a slot that receives the retractable connector and the torsion spring assists the extension of the retractable platform and counter forces that may otherwise cause the platform to bind as it extends and retracts. A flexible circuit is attached to the torsion spring and it allows electrical communication between the retractable connectors and the communication card. The flexible circuit is preferably attached to the retractable connector and the communication card by zero insertion force connectors. Because the flexible circuit is bonded to the torsion spring, the movement of the circuit is constrained and that helps protect the circuit from damage.

26 Claims, 5 Drawing Sheets

RETRACTABLE CONNECTOR FOR USE WITH ELECTRONIC DEVICES

BACKGROUND OF THE INVENTION

1. Field of the Invention

The present invention relates to a retractable connector that allows electrical communication to be established with an electronic device. More particularly, the present invention relates to a spring driven system that smoothly moves the retractable connector between an extended position and a retracted position.

2. Description of Related Art

Electronic devices are widely used and have often become an indispensable resource for businesspersons, students and others. For example, the use of personal digital assistants (PDAs), laptop computers, palm computers, portable computers, mobile telephones and other types of electronic devices are becoming commonplace and new electronic devices, such as digital music players and cameras, are being introduced. Significantly, many of these electronic devices are readily portable and designed to be used in a variety of situations.

Electronic devices, such as portable computers, are also beginning to provide functionality to users beyond their original purpose. For example, many conventional portable computers did not provide a user with access to remote computer systems such as the Internet. Today, however, many computers provide a user with the ability to access remote computer networks or systems, including the Internet. The ability to access these remote computer systems, however, requires a connection that allows the computer to communicate with the remote computer system. Accordingly, many conventional portable computers require an interface that permits the computer to be connected with the Internet or other computer system.

Frequently computer expansion cards are used with these conventional portable computers to allow a user to access the Internet or other remote computer networks. Known expansion cards, such as modem cards, often include a retractable platform that can be stored inside the card in a retracted position or it can extend outwardly from the card in an extended position. In the extended position, a receptacle is exposed to receive a communication plug that allows the modem card to be connected to a telephone network. Thus, the retractable platform provides an electrical and physical interface between the modem card and the telephone network.

In greater detail, when the retractable platform is extended and the receptacle or jack portion is exposed, a communication plug is inserted into the receptacle. The communication plug is typically a RJ series connector plug and it is attached to one end of a cable. The other end of the cable may include another RJ series connector plug that is connected to the telephone network, which provides access to remote computer networks and systems such as the Internet. Thus, the modem card with the retractable platform allows as a portable computer to be electrically connected to the telephone network, which provides access to remote!computer systems such as the Internet.

The retractable platform for a conventional modem card is a slidable plate that fits within grooves or tracks in the modem card. The slidable plate includes the receptacle that receives the RJ series connector plug and the slidable plate is movable between the extended and retracted positions. A compression spring is attached to one side of the slidable plate and it assists in moving the plate between the extended and retracted positions. In particular, the compression spring aids in pushing the slidable plate into the extended position and holding it in that position. The compression spring also helps hold the slidable plate in the retracted position such that the plate is not inadvertently extended. Because the compression spring is located on one side of the slidable plate, it provides an uneven spring force on the plate. In addition, the compression spring creates a moment arm as the slidable plate is moved between the retracted and extended positions because the spring force is directed only towards one side of the plate.

Conventional modem cards also include a flex circuit that electronically connects the retractable platform to the communication card. The flex circuit is located in the slot in the modem card that receives the retractable platform, and the flex circuit is repeatedly bent and straightened as the slidable plate is moved between the extended and retracted positions. Because the movement of the flex circuit is not constrained or controlled, the flex circuit may be caught between moving parts, or the flex circuit may become twisted, tangled or bent as the retractable platform is extended and retracted. This may cause the flex circuit to break, fracture, malfunction or otherwise stop working. In addition, the flex circuit may become loosened or even disconnected from either the retractable platform and/or the communication card because the movement of the flex circuit is not constrained. Disadvantageously, if the flex circuit malfunctions or becomes disconnected, the modem card cannot be used and this may prevent the user from communicating with the remote computer system. In addition, the flex circuit may be difficult to repair or replace because of the tight tolerances and small space in which the circuit is located.

SUMMARY OF THE INVENTION

A need therefore exists for a communication card with a retractable connector that provides effective and reliable communication with a remote computer or network system, and eliminates the above-described disadvantages and problems.

One aspect of the present invention is a communication card with a retractable connector and a torsion spring. The torsion spring is generally U-shaped with a first end engaging the communication card and a second end engaging the retractable connector. The spring force of the torsion spring is preferably generally aligned with the center portion of the retractable connector and along an axis upon which the connector is extended and retracted. Because the spring force is generally centrally aligned with the retractable connector and along the axis upon which the connector is extended and retracted, the connector smoothly extends and retracts without binding, sticking or twisting. In addition, the torsion spring preferably has a generally constant or linear spring force so that the retractable connector moves uniformly.

Another aspect is la communication card with one or more cutouts or notches that are sized and configured to receive the torsion spring when the retractable connector is in the retracted position. Significantly, the cutouts or notches allow the torsion spring to have a relatively large radius of curvature and the spring is not excessively compressed, deformed or pinched in the retracted position. Advantageously, the cutouts or notches can be located in the retractable connector and/or a portion of the communication card, such as the printed circuit board. The cutouts and notches also guide the torsion spring into a storage position and help prevent damage to the torsion spring.

Still another aspect is a communication card with a flexible circuit attached to the torsion spring. Because the flexible circuit is attached to the torsion spring, it helps control the movement of the circuit and that improves the life of the circuit. For example, because the torsion spring has a relatively large radius of curvature, the flexible circuit also has a relatively large radius of curvature. This prevents the flexible circuit from being excessively compressed, inched or twisted, and this prolongs the life of the circuit. In addition, the flexible circuit has greater reliability and integrity because the circuit has a larger bending radius and is subjected to less force. The flexible circuit is also protected from damage because it is contained within the sidewalls of the housing of the communication card. Additionally, because the flexible circuit is generally a constant distance from the housing, this improves the performance and reliability of the circuit because there is little or no impedance change.

Yet another aspect is a communication card with a flexible circuit that electrically connects the retractable connector to the communications card by a pair of connectors. The connectors are preferably zero insertion force (ZIF) connectors that require very little force and effort to connect the flexible circuit to the communication card and the retractable platform. Advantageously, the ZIF connectors position the flexible circuit in the desired location and allow an automated process to connect the flexible circuit to the communication card and the retractable connector. Significantly, because the torsion spring is also attached to the flexible circuit, the ZIF connectors also position the torsion spring in the desired location.

A further aspect is a communication card with a retractable connector that includes multiple connectors and/or receptacles, which allow the communication card to be connected to various communication systems. Advantageously, this enhances the functionality of the communication card because it can be connected to two or more communication networks either simultaneously or independently. For example, the retractable connector can include two receptacles in which one receptacle is sized to receive a RJ-11 series connector plug and the other receptacle is sized to receive a RJ-45 series connector plug. This allows the communication card to be connected to a telephone network and a computer network, such as a local area network (LAN) or a wide area network (WAN), at the same time or separately.

Another aspect is a communication card including a retractable connector with an increased size that provides additional room for a plurality of connectors and/or receptacles. The increased size of the retractable connector also allows other components to be mounted on the retractable connector. For example, the increased size may allow a plurality of connectors or receptacles, and/or one or more antennas or other devices for wireless communication to be mounted on the retractable connector. Therefore, the increased size may allow the retractable connector to be connected to a wireless system and/or a hard-wired system. The retractable connector can be configured to allow the communication card to be connected to the wireless system or the hard-wired system either simultaneously or independently.

Yet another aspect is a communication card with a retractable connector that has an increased width to allow one or more connectors or receptacles to be mounted on the retractable connector. Advantageously, the increased width allows multiple connectors or receptacles to be mounted along the forward edge of the retractable connector. In addition, the increased width allows an antenna or other wireless devices to be mounted on the retractable connector. Significantly, the increased width may also allow two or more antennas or wireless devices to be mounted on the retractable connector and separated by a suitable distance. The retractable connector could also have an increased length and other configurations that are appropriate for the intended use of the retractable connector.

Still another aspect is a communication card with a guide structure that guides the movement of the retractable connector. The guide structure advantageously controls the extension and retraction of the retractable connector, and the guide structure allows the retractable connector to be smoothly extended and retracted. The guide structure includes a guidepost and an elongated slot located in the retractable connector. The elongated slot is generally centrally located within the retractable connector and aligned with an axis upon which the retractable connector is extended and retracted. The guide structure permits the retractable connector to be extended and retracted along the axis, and it prevents the platform from moving side-to-side or laterally. The guide structure also prevents the retractable connector from being unintentionally removed from the communication card and it increases the structural integrity of the communication card.

Another aspect is a communication card including a retractable connector with a guide structure and a compression spring. The compression spring is mounted between the guidepost and one end of an elongated slot, and it aids in moving the retractable connector between the extended and retracted positions. The compression spring also helps hold the retractable connector in a retracted position so that the connector is not inadvertently extended. Preferably, the compression spring has a generally constant or linear spring force such that the retractable connector is extended and retracted at a generally uniform rate. In addition, the elongated slot and compression spring are preferably centrally located in the retractable connector and generally aligned with the longitudinal axis upon which the connector is extended and retracted. Significantly, because the spring force is generally centrally located with respect to the retractable connector and aligned with the longitudinal axis in which the platform is extended or retracted, the retractable connector moves in a relatively smooth and constant manner.

Additional aspects, features and advantages of the present invention will become more apparent from the following detailed description of the preferred embodiments and appended claims.

BRIEF DESCRIPTION OF THE DRAWINGS

The appended drawings contain figures of preferred embodiments of the communication card with a retractable connector. The above-mentioned features, aspects and advantages of the communication card with a retractable connector, as well as other features, aspects and advantages, will be described in connection with the preferred embodiments. The illustrated embodiments, however, are only intended to illustrate the invention and not limit the invention. The drawings contain the following figures.

DETAILED DESCRIPTION OF THE PREFERRED EMBODIMENTS

The present invention is generally directed towards a retractable connector for use with an electronic device. The retractable connector is preferably attached to a communication card in order to allow an electronic device such as a computer to communicate with another electronic device or communication system. The principles of the present invention, however, are not limited to a retractable platform for a communication card. It will be understood that, in light of the present disclosure, the retractable platform can successfully be used in connection with other types of electrical equipment, electrical devices, communication systems and communication networks.

Additionally, to assist in the description of the retractable connector and communication card, words such as top, bottom, front, rear, right and left are used to describe the accompanying figures. It will be appreciated, however, that the present invention can be used in a variety of desired position-including various angles, sideways and even upside down. Further, the various components of the retractable connector and communication card, which are described in more detail below, can be located in other suitable locations and positions. A detailed description of the preferred embodiments of the retractable connector and communication card now follows.

Figure 1:
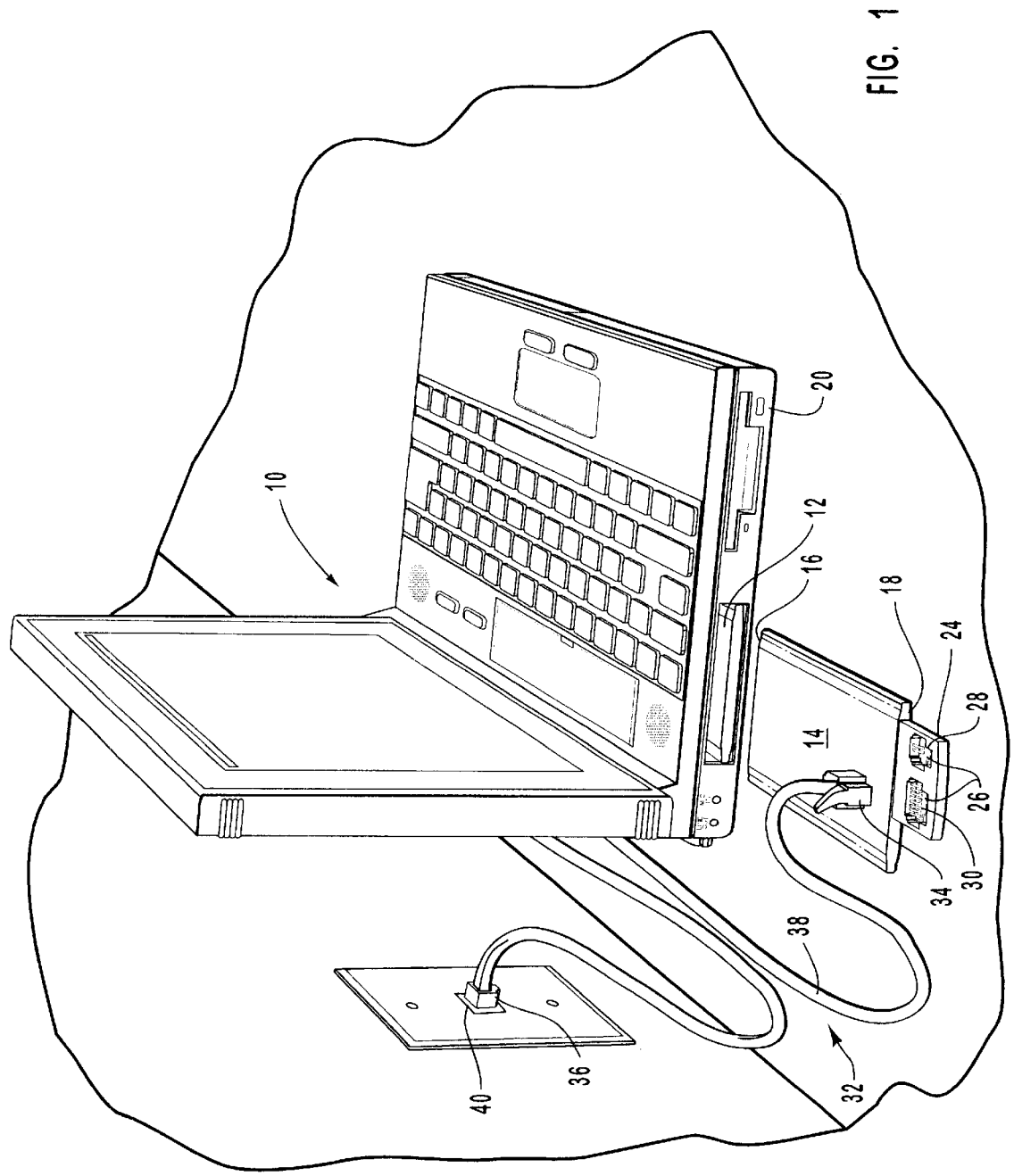
FIG. 1 is a communication card with a retractable connector in accordance with a preferred embodiment of the present invention, illustrating the communication card in connection with the receiving socket of a portable or laptop computer.

FIG. 1 illustrates a computer 10 including a slot 12 that is configured according to Personal Computer Memory Card International Association (PCMCIA) standards to receive a communications card 14, which is also configured according to the PCMCIA standards. The PCMCIA standards are well known to those skilled in the art and are available from the Personal Computer Memory Card International Association of Santa Clara, Calif. These standards allow for the interchangeability of communication cards developed by different manufacturers. One skilled in the art will appreciate that the slot 12 and/or the communication card 14 may have other suitable configurations and characteristics, and neither the slot nor the communication card has to comply with the PCMCIA standards.

The computer 10 is capable of performing additional functions when the communication card 14 is inserted into the slot 12. For instance, the communication card 14 may be a modem or a network interface card that provides the computer 10 with the ability to interface with a telephone based system or with a computer network. One skilled in the art will appreciate that the communication card 14 can be used to perform a wide variety of desired functions. The communication card 14 can also include additional features, such as increased memory.

As shown in FIG. 1, the communication card 14 includes an insertion end 16 that is inserted into the slot 12 where it is electrically and mechanically coupled to the computer 10. When the card 14 is fully inserted within the slot 12, the outward end 18 of the card 14 is preferably flush with the sidewall 20 of the computer 10. The card 14 further comprises a retractable connector or platform 24 that is located in the outward end 18 of the card 14. The retractable connector 24 may be either retracted or extended as desired by the user. In particular, the retractable connector 24 is movable between a retracted position wherein the connector can be stored within the body of the communication card 14 and an extended position wherein a portion of the connector extends outwardly from the body of the communication card 14. It will be appreciated, however, that the retractable connector 24 does not have to be used in connection with a communication card 14 and, for example, the retractable connector can be directly connected to a suitable electronic device.

The retractable connector 24 shown in the accompanying figures includes dual jacks, receptacles or receiving portions 26 that allow a user to connect the communication card 14 to suitable networks, communication systems, computer systems and the like. As shown in the accompanying figures, the first receiving portion 28 is sized and configured to receive a RJ-11 series connector plug and the second receiving portion 30 is sized and configured to receive a RJ-45 series connector plug. The RJ-11 series connector plug is typically used to connect the retractable connector 24 to a telephone network and the RJ-45 series connector plug is often used to connect the retractable connector to a local area network (LAN). Thus, the retractable connector 24 has an increased width that provides additional room for multiple connectors and/or receiving portions 26.

One skilled in the art will appreciate that the retractable connector 24 can include any number or type of connectors or receiving portions 26 such that the communication card 14 can be connected to any suitable number or type of communication systems or networks. For example, the retractable connector 24 may include one or more connectors or receiving portions 26 that are configured to be connected to communication systems such as a telephone network, LAN, wide area network (WAN), Internet, Ethernet, and the like. Additionally, the retractable connector 24 may be attached to these communication systems either at the same time or separately, which allows the communication card 14 to be configured to communicate with these systems either simultaneously or independently. Further, as discussed below, the retractable connector 24 can include other types of connectors that allow, for example, wireless or infrared communication.

FIG. 1 also illustrates a cable and plug assembly 32 that is used to connect the communication card 14 to a computer network or telephone system. The cable and plug assembly 32 includes plugs 34 and 36 that are attached to the ends of a cable 38. The first plug 34 is an RJ-11 series connector plug that is adapted to be connected to the first receiving portion 28, but the plugs and receiving portion could be of any suitable type or configuration. The plug 36 attached to the other end of the cable 38 is also preferably an RJ series connector plug and it is removably inserted in a wall jack 40, which provides an interface to a telephone system or a computer network. Of course, the other end of the cable 38 could also be connected to any appropriate communication system by any suitable type of connector, or it could be directly connected.

While the retractable connector 24 is described in detail in connection with a communication card 14 configured to be received within a corresponding slot 12 in a laptop computer 10, one skilled in the art will appreciate that the communication card and the retractable connector may be used in conjunction with various types of computers including personal computers, notebook computers, hand-held devices, personal data assistants (PPAs), multi-processor systems, microprocessor-based or programmable consumer electronics, network PCs, minicomputers, mainframe computers, etc. In addition, the retractable connector 24 can be directly connected to various electronic devices such as cameras, cellular telephones, pagers and the like.

Figure 2A:
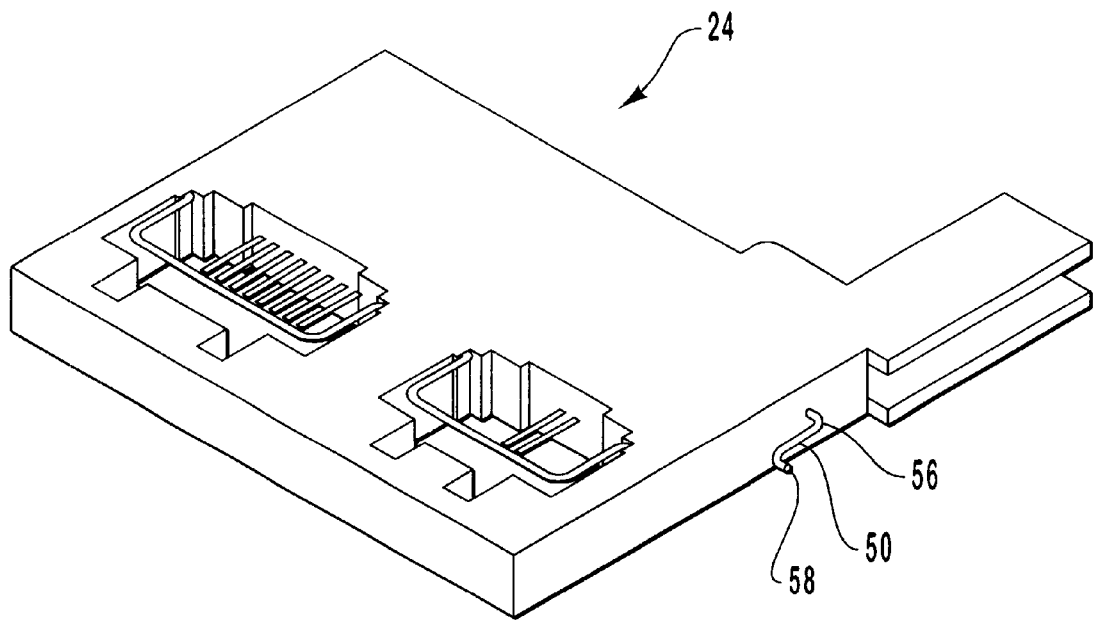
FIG. 2a is a perspective view of a portion of the retractable connector shown in FIG. 1, illustrating an RJ-11 series connector receptacle, an RJ-45 series connector receptacle and a cam follower.
Figure 2B:
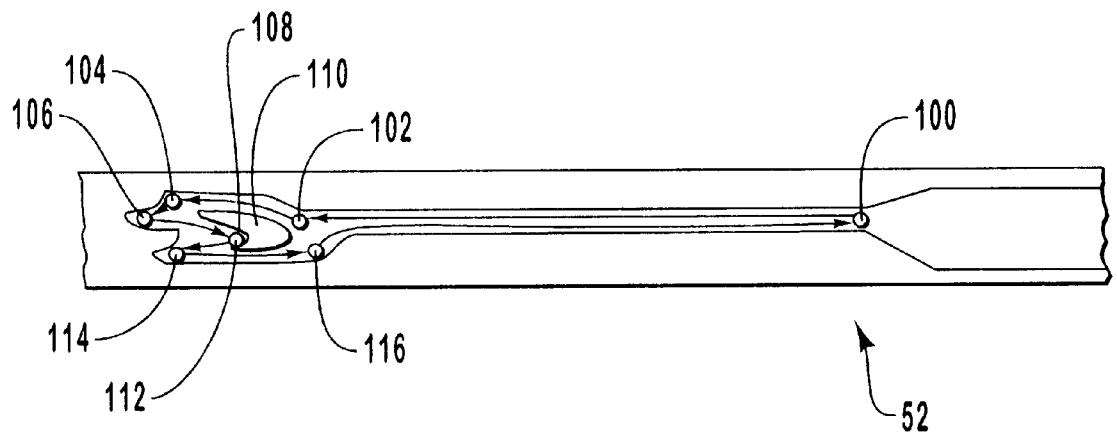
FIG. 2b is a side view of a cam track that is sized and configured to receive the cam follower shown in FIG. 2a, illustrating the path followed by the cam follower as the retractable connector is extended and retracted from an electronic device such as the communication card shown in FIG. 1.

As shown in FIGS. 2a and 2b, the retractable connector 24 includes a cam follower 50 that is inserted into a cam track 52. The cam track 52 is disposed along an inner surface of the communication card 14, or other suitable electronic device, and the cam follower 50 follows the cam track 52 as the connector 24 is extended and retracted. The cam follower 50 and the cam track 52 form part of a cam system 54, and movement of the cam follower in the cam track is described in more detail below.

Figure 3:
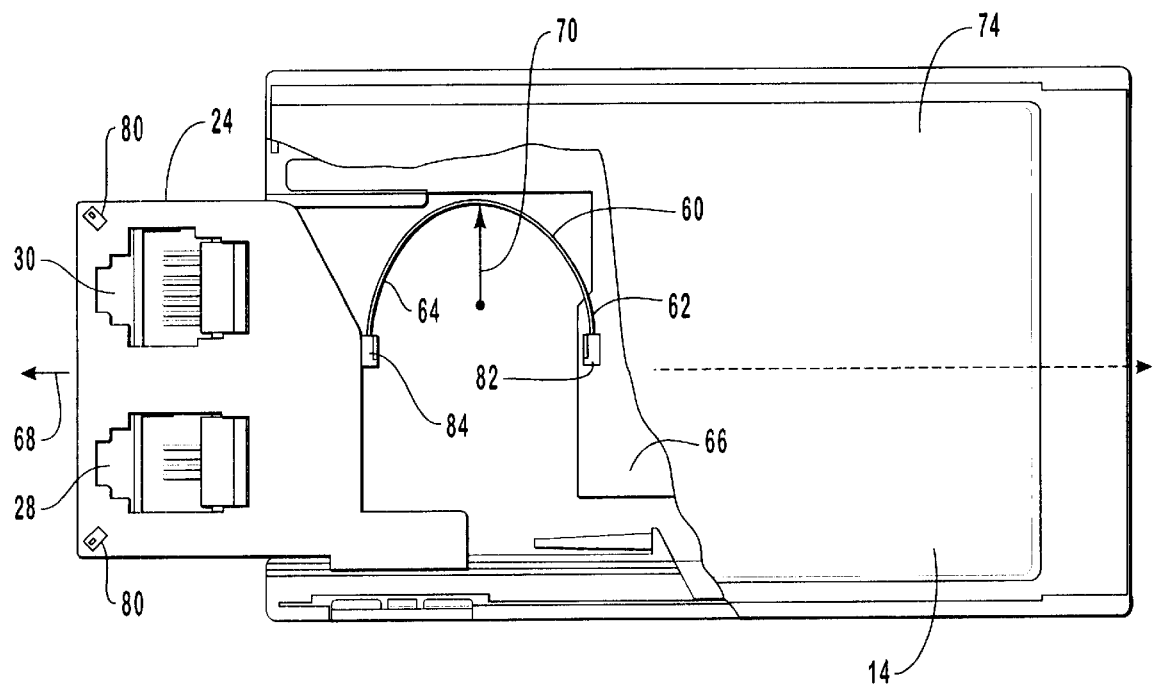
FIG. 3 is a top view of the communication card with the retractable connector shown in FIG. 1, with a portion of the communication card cut away, illustrating the retractable connector in an extended position.
Figure 4:
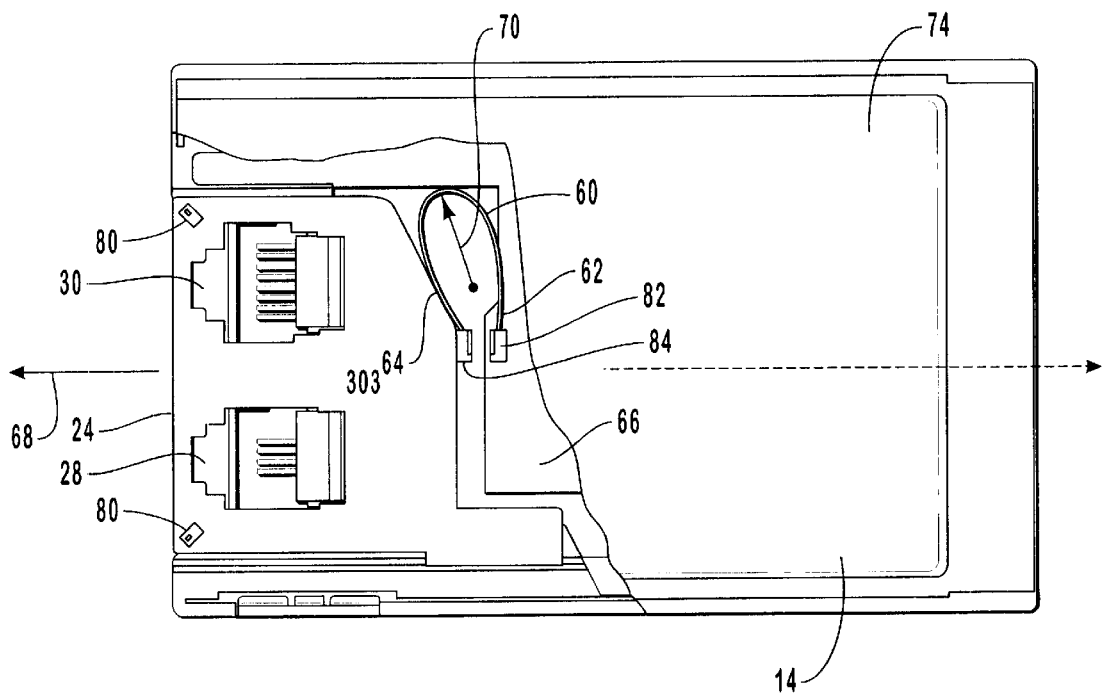
FIG. 4 is a top view of the communication card with the retractable connector shown in FIG. 3, illustrating the retractable connector in a retracted position.

As seen in FIGS. 3 and 4, the retractable connector 24 is slidably disposed within a slot in the communication card 14 and it is slidable between an extended position and a retracted position. A torsion spring 60 is disposed within the slot between the retractable connector 24 and the communication card 14. The torsion spring 60 includes a first end 62 connected to the communication card 14 and a second end 64 connected to the retractable connector 24. Preferably, the first end 62 is connected to a printed circuit board or substrate 66 disposed within the communication card 14, but the torsion spring 60 could be attached to any suitable portion of the card. The torsion spring 60 has a generally U-shaped and provides generally a constant or linear spring force as the spring is expanded and compressed so that the retractable platform 24 moves in a generally uniform manner. Preferably, the torsion spring 60 is located such that the spring force exerted by the torsion spring is generally directed towards the center of the connector 24 along a longitudinal axis 68 in which the retractable connector 24 is extended and retracted. By directing the spring force towards the center of the retractable connector 24 and along the longitudinal axis 68, the connector 24 may be smoothly retracted and extended, without hesitating, binding, or sticking.

The torsion spring 60 also helps compensate for forces that may cause the retractable connector to bind or otherwise malfunction as it is extended and retracted from the body of the communication card 14. For example, the torsion spring 60 provides a force that helps counter a moment arm introduced by a user pushing on an edge or corner of the retractable connector 24. In addition, because the force provided by the torsion spring 60 is directed along the longitudinal axis 68 towards the center of the retractable connector 24, the connector is not pushed in a lateral direction or towards a side of the communication card 14 by the spring. Thus, the torsion spring 60 helps ensure that the cam follower 50 will not be displaced from the cam track 52, which helps ensure that the retractable connector will function as intended.

As shown in the accompanying figures, the torsion spring 60 has a relatively large radius of curvature 70. In order to accommodate the large radius of curvature 70, a portion of the retractable connector 24 is cut away such that the torsion spring 60 is not excessively compressed between the connector and the communications card 14. Alternatively, a portion of the communication card 14, such as the printed circuit board 66, may be cut away to ensure that the torsion spring 302 is not excessively compressed. One skilled in the art will also appreciate that a portion of both the communication card 14 and the retractable connector 24 may be cut away to accommodate the torsion spring 60 in a manner that protects the spring from damage.

As shown in the accompanying figures, the retractable connector 24 includes two receiving portions 24 that are sized and configured to be electrically connected to any suitable communication system or network. Advantageously, the retractable connector 24 can also be used in conjunction with a wireless system. For example, the retractable connector 24 can include one or more antennas 80 to provide an interface with a wireless system. Advantageously, the larger width of the retractable connector 24 allows the antennas 80 to be positioned in desired locations and separated by desired distances. For example, the antennas 80 may be positioned proximate the corners of the retractable connector 24 to allow the antennas to be separated by a distance of 1.5 inches, or even greater. This distance permits the antennas 80 to be used with various wireless communication systems, such as wireless systems that incorporate Bluetooth technology. One skilled in the art will recognize the number and distance separating the antennas 80 may depend, for example, upon the type of wireless communication system.

The retractable connectors 24 shown in the accompanying figures illustrate two antennas 80 and two jacks or receiving portions 26. It will be appreciated that the antennas 80 can be used in combination with one or more receiving portions 26, but the wireless system does not require the use of any receiving portions. Advantageously, the antennas 80 are solely located in the retractable connector 24 and no portions of the antennas are moved or extended relative to the retractable connector. Thus, in order to extend the antennas 80 from the communication card 14, the retractable portion 24 is simply extended from the card and the antennas themselves do not have to be moved or manipulated. This greatly simplifies the use of the communication card 14 in conjunction with a wireless system.

The antennas 80 mounted on the retractable connector 24 are preferably chip antennas because they require a small area. For example, a Murata 8220 chip antenna manufactured by Murata Electronics North America, Inc. of Smyrna, Georgia, may be used because it has a small size of about 4 mm by 1 mm by 20 mm. It will be appreciated, however, that other suitable antennas with different sizes and configurations may also be used.

Figure 6:
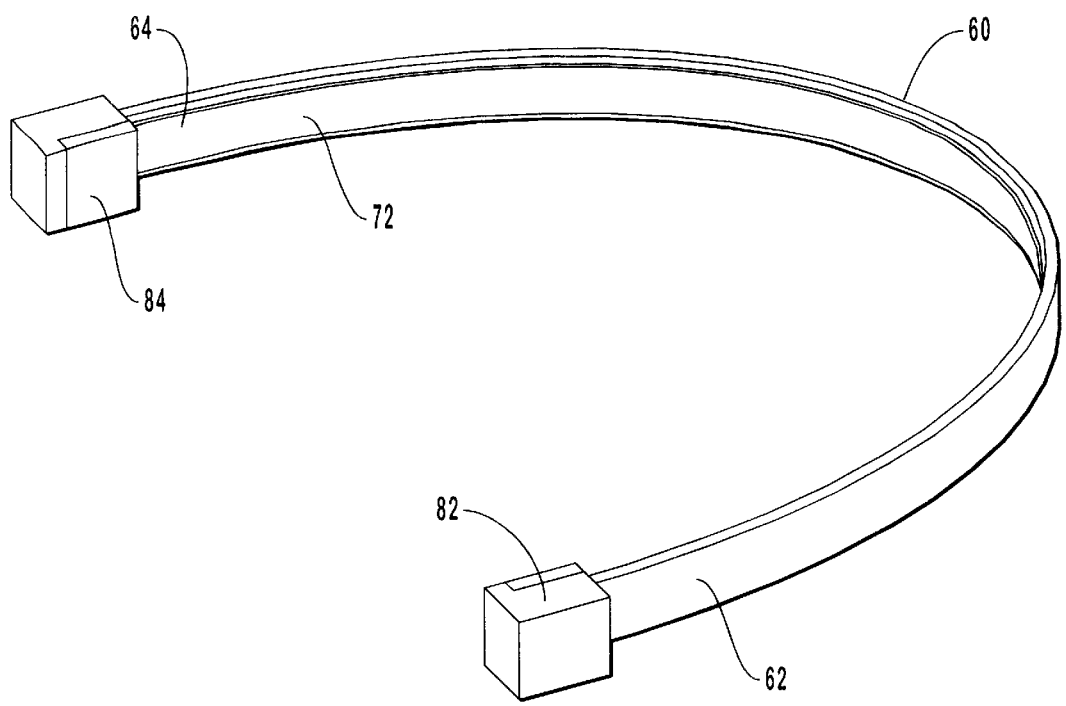
FIG. 6 is an enlarged perspective view of the torsion spring shown in FIGS. 3–5, illustrating a flexible circuit bonded to the torsion spring and connectors attached to the ends of the flexible circuit.

As best seen in FIG. 6, a flexible circuit 72 is attached along a side of the torsion spring 60. The flexible circuit 72 allows electrical communication to be established between the retractable connector 24 and the communication card 14. In greater detail, the flexible circuit 72 is attached to either or both sides of the torsion spring 60 by a pressure sensitive adhesive. One skilled in the art will also appreciate that the flexible circuit 72 and torsion spring 60 could be integrally formed or connected in any suitable manner, and that the flexible circuit and torsion spring may be permanently or removably attached. Advantageously, because the flexible circuit 72 is attached to the torsion spring 60, the movement of the circuit is controlled or limited. For example, because the torsion spring 60 has a relatively large radius of curvature 70, the flexible circuit 72 also has a corresponding large radius of curvature. This prevents the flexible circuit 72 from being excessively compressed, pinched or bent, and this improves the life of the circuit. In addition, the flexible circuit 72 has greater reliability and integrity because it has a larger bending radius and is subjected to less bending force. Further, the flexible circuit 72 is protected from damage because it is located within the housing 74 of the communication card 14. In particular, if the housing 74 of the communication card 14 is constructed from metal, the metal housing protects the flexible circuit 72 from electromagnetic interference. Significantly, because the torsion spring 60 also helps keep the flexible circuit 72 a constant distance from the metal housing 74, the impedance of the circuit is not changed and that results in improved performance and reliability.

The flexible circuit 72 could also comprise a transmission line, which may be particularly useful when the retractable connector 24 includes one or more antennas 80 for wireless communication. Additionally, the torsion spring 60 may be comprised of a material that provides a ground plane for the circuit or transmission line 72 such that noise or radiation that may interfere with signal transmission and reception may be further reduced or eliminated. Thus, depending upon whether the retractable connector 24 is intended to be used with a wireless and/or hand-wired system, torsion spring 60 and flexible circuit 72 may be appropriately configured.

The flexible circuit 72 is attached to the communication card 14 and retractable connector 24 by zero insertion force (ZIF) connectors 82 and 84. Advantageously, the ZIF connectors 82 and 84 lower manufacturing costs and improve reliability because they allow the flexible circuit 72 to be quickly and easily attached to the communication card 14 and the retractable connector 24. Additionally, the ZIF connectors 82 and 84 allow the flexible circuit 72 to be quickly and easily attached, and the connectors allow the circuit to be manufactured by an automated process, such as pick-and-place manufacturing techniques. The ZIF connectors 82 and 84 also allow the torsion spring 60 to be positioned in the desired location and attached to the communication card 14 and the retractable connector 24. While the torsion spring 60 is shown as being attached to the retractable connector 24 and the substrate 66 of the communication card 14 by the connectors 82 and 84, the torsion spring may be connected to the connector and communication card using other methods. For example, the first and second ends 62, 64 of the torsion spring 60 may rest within corresponding notches cut in the retractable connector 24 and the printed circuit board 66. Alternatively, the torsion spring 60 may be permanently connected to either the connector 24, the card 14 or to both the connector and the card.

Figure 5:
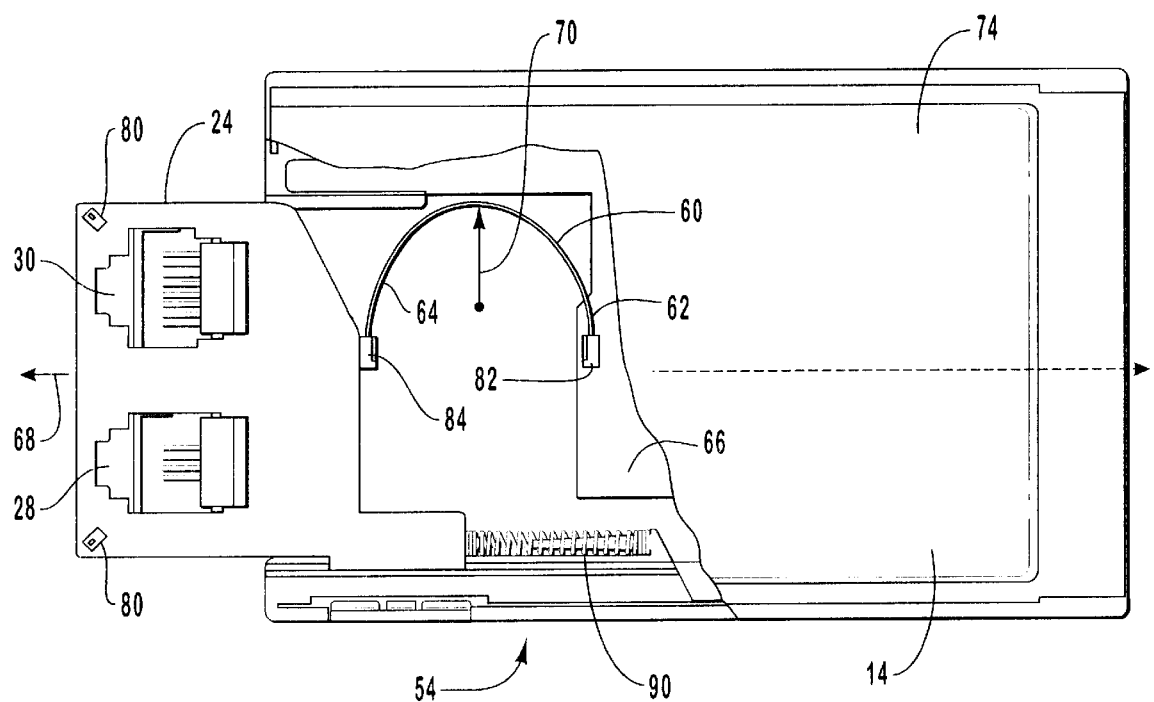
FIG. 5 is a top view of a communication card with a retractable connector in accordance with another preferred embodiment of the present invention, with a portion of the communication card cut away, illustrating the retractable connector in an extended position.

FIG. 5 illustrates another preferred embodiment of the retractable connector with a compression spring 90 attached to one side of the connector 24. The compression spring 90 assists the torsion spring 60 in extending the connector 24 and also ensures that the connector extends and retracts in a smooth manner. In particular, the compression spring 90 provides additional force to assist the torsion spring 60 in extending the connector 24. Advantageously, the position of the torsion spring 60 may be adjustable to insure that the combined spring force of the torsion spring and the compression spring 90 is directed along the longitudinal axis 68 of the connector 24. Thus, by appropriately positioning the torsion spring 60, the extension and retraction of the connector 24 is smooth and does not bind, hesitate, or stop.

Figure 7:
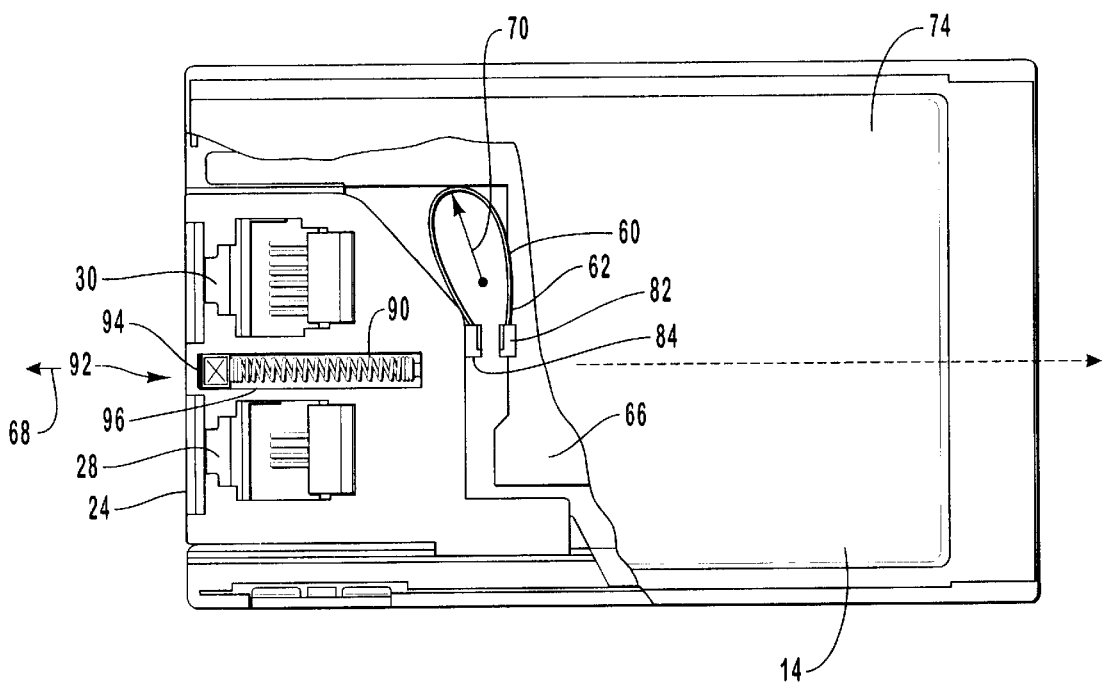
FIG. 7 is a top view of a communication card with a retractable connector in accordance with yet another preferred embodiment of the present invention, illustrating a guide structure that assists in moving the connecter and minimizing its lateral movement.

As shown in FIG. 7, in another preferred embodiment, the retractable connector 24 includes a guide structure 92 for guiding the extension and retraction of the connector. The guiding structure includes a post 94 and an elongated slot 96. The post 94 is connected to the housing 74 of the communication card 14 and it is positioned within the slot 96. The sides of the post are configured to slidingly engage the elongated sides of the slot to guide the retractable connector 24 along the longitudinal axis 68. Thus, as the retractable connector 24 is extended and retracted, the slot 96 and post 94 guide the movement of the connector along the longitudinal axis 68 and prevent the connector from excessive lateral or side-to-side movement. Advantageously, the slot 96 preferably has a length that prevents the retractable connector 24 from being over extended or over retracted. Thus, the connector 24 is able to extend until the post 94 comes into contact with an end of the slot 96, at which point further extension of the connector is prevented. Similarly, the other end of the elongated slot 96 is configured to contact the post 94 before the connector 24 is excessively retracted. Thus, the guide structure 92 provides the retractable connector 24 with a full range of motion in the extension and retraction directions, while preventing damage to the connector and minimizing the lateral movement of the connector. Of course, one skilled in the art will appreciate that the post 94 and the slot 96 can have other suitable shapes and configurations suitable for the intended purpose of the guide structure 92.

A compression spring 98 is preferably located within the slot such that one end of the compression spring abuts the post 94 and the opposing end of the compression spring abuts an end of the slot. The compression spring 98 provides a spring force, either alone or in combination with the torsion spring 60, used during the extension and retraction of the connector 24 to ensure: that the connector operates smoothly and without binding. Significantly, the guide structure 92, the torsion spring 60, and the compression spring 98 ensure that the retractable connector is smoothly extended and retracted while restricting the lateral movement of the connector 24.

FIGS. 2a and 2b are now referenced to describe in greater detail how the torsion spring 60 is utilized in the extension and retraction of the connector 24. The cam follower 50 is connected to the retractable connector 24 such that the cam follower is allowed to rotate about a cam follower axis 50 when a force is applied to a tip of the cam follower 50. The tip 58 of the cam follower 50 is positioned within the cam track 52 and the cam follower moves within the: cam track 52 as the retractable connector 24 is moved between the extended and retracted positions. Thus, as the retractable connector 24 is extended or retracted, the cam follower 50 follows the cam track 52 and the cam system 54 holds the retractable connector 24 in the retracted or extended positions.

For example, assuming that the retractable connector 24 is in an extended position, the cam follower 50 is located at position 100 within the cam track 52. To retract the connector 24 within the body of the communication card 14, a user depresses the connector 24 and as the user depresses the connector 24, the cam follower 50 follows the arrows illustrated in the cam track 52 through positions 102, 104 and 106. As the cam follower 50 proceeds through these positions, the torsion spring 60 is being compressed. In embodiments of the present invention having a compression spring 98 located along one edge of the connector 24, the compression spring is also being compressed as the user depresses the connector 24.

When the cam follower 50 is at position 106, the user ceases to depress the retractable connector 24 into the communication card 14 and the torsion spring begins to expand. This pushes the cam following 50 into the depression 108 in the stop 110. In this position 112, the cam follower 50 is held against the stop 110 by the force provided by the torsion spring 60 and this holds the connector 24 in the retracted position.

To extend the connector 24, a user depresses the connector 24 and the shape of the cam track 52 causes the cam follower 50 to proceed from position 112 through positions 114 and 116. Because the cam track 52 positions the cam follower 50 such that the cam follower will not come into contact with the stop 110, the force provided by the torsion spring 60 extends the connector 24 until the connector is fully extended. When the connector 24 is fully extended, the cam follower 50 occupies the position 100. In this manner, the connector 24 may be repeatedly retracted and extended as needed.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An apparatus for use with an electronic device, the apparatus comprising:
   a retractable connector movable between a retracted position and an extended position; and
   a torsion spring including a first end and a second end, the first end of the torsion spring connected to the retractable connector and the second end of the torsion spring connected to the electronic device, the torsion spring adapted to exert an extension force that tends to move the retractable connector from the retracted position to the extended position.

2. The apparatus as in claim 1, further comprising a flexible circuit attached to the torsion spring, the flexible circuit providing an electrical connection between the retractable connector and the electronic device.

3. The apparatus as in claim 1, wherein the retractable connector is movable between the retracted position and the extended position along a longitudinal axis, and wherein a spring force of the torsion spring is generally aligned with the longitudinal axis.

4. The apparatus as in claim 1, further comprising at least one receptacle in the retractable connector that is adapted to receive an RJ series connector plug.

5. The apparatus as in claim 1, further comprising at least one antenna attached to the retractable connector.

6. The apparatus as in claim 5, wherein the at least one antenna is a chip antenna.

7. The apparatus as in claim 2, further comprising a first zero insertion force connector is used to attach a first end of the flexible circuit to the electronic device and a second zero insertion force connector is used to attach a second end of the flexible circuit to the retractable connector.

8. The apparatus as in claim 1, further comprising a transmission line attached to the torsion spring, wherein the torsion spring functions as a ground plane for the transmission line.

9. The apparatus as in claim 1, further comprising a guidepost at least partially disposed within a slot in the retractable connector, the guidepost being adapted to minimize lateral movement of the retractable connector.

10. The apparatus as in claim 1, further comprising a guide structure attached to the electronic device, the guide structure being adapted to minimize lateral movement of the retractable connector.

11. The apparatus as in claim 10, wherein the retractable connector further comprises:
    an elongated slot located in the retractable connector;
    a post extending through a portion of the elongated slot; and
    a compression spring including a first end and a second end, the first end of the compression spring abutting the post and the second end of the compression spring abutting an end of the elongated slot.

12. The apparatus as in claim 1, further comprising a cutout in the retractable connector, the cutout being sized and configured to store at least a portion of the torsion spring when the retractable connector is in the retracted position.

13. An electronic device including a retractable connector that is movable between an extended position and a retracted position along an axis, the retractable connector being configured to electrically connect the retractable connector to a communication system or network, the electronic device comprising:
    a torsion spring including a first end attached to the electronic device and a second end attached to the retractable connector; and
    a flexible circuit attached to the torsion spring, the flexible circuit including a first end and a second end, the flexible circuit adapted to provide electrical communication between the retractable platform and the electronic device.

14. The electronic device as in claim 13, further comprising a first zero insertion force connector attached to the first end of the flexible connector and a second zero insertion force connector attached to the second end of the flexible connector.

15. An electronic device comprising:
    a communication card including a housing;
    a printed circuit board disposed within the housing of the communication card;
    a retractable connector connected to the communication card, the retractable connector movable between a retracted position and an extended position; and
    a torsion spring including a first end and a second end, the first end of the torsion spring connected to the printed circuit board.

16. The apparatus as in claim 15, further comprising a flexible circuit attached to the torsion spring, the flexible circuit providing an electrical connection between the retractable connector and the electronic device.

17. The apparatus as in claim 15, wherein the retractable connector is movable between the retracted position and the extended position along a longitudinal axis, and wherein a spring force of the torsion spring is generally aligned with the longitudinal axis.

18. The apparatus as in claim 15, further comprising at least one receptacle mounted in the retractable connector that is adapted to receive an RJ series connector plug.

19. The apparatus as in claim 15, further comprising at least one antenna attached to the retractable connector.

20. The apparatus as in claim 19, wherein the at least one antenna is a chip antenna.

21. The apparatus as in claim 15, further comprising a first zero insertion force connector is used to attach a first end of the flexible circuit to the electronic device and a second zero insertion force connector is used to attach a second end of the flexible circuit to the retractable connector.

22. The apparatus as in claim 15, further comprising a transmission line attached to the torsion spring, wherein the torsion spring functions as a ground plane for the transmission line.

23. The apparatus as in claim 15, further comprising a guidepost at least partially disposed within a slot in the retractable connector, the guidepost being adapted to minimize lateral movement of the retractable connector.

24. The apparatus as in claim 15, further comprising a guide structure attached to the electronic device, the guide structure being adapted to minimize lateral movement of the retractable connector.

25. The apparatus as in claim 24, wherein the retractable connector further comprises:

an elongated slot located in the retractable connector;

a post extending through a portion of the elongated slot; and a compression spring including a first end and a second end, the first end of the compression spring abutting the post and the second end of the compression spring abutting an end of the elongated slot.

26. The apparatus as in claim 15, further comprising a cutout in the retractable connector, the cutout being sized and configure to store at least a portion of the torsion spring when the retractable connector is in the retracted position.

* * * * *